(12) United States Patent
Walters

(10) Patent No.: US 6,265,231 B1
(45) Date of Patent: Jul. 24, 2001

(54) PROCESS CONTROL VIA VALVE POSITION AND RATE OF POSITION CHANGE MONITORING

(75) Inventor: Joseph W. Walters, Orlando, FL (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/410,189

(22) Filed: Sep. 30, 1999

(51) Int. Cl.$^7$ .................................................. H01L 21/00
(52) U.S. Cl. ................... 438/8; 156/345; 216/59; 216/60; 438/9; 438/14; 438/710
(58) Field of Search ................... 438/8, 9, 14, 16, 438/689, 710, 729, 730; 156/345 V, 345 MT; 216/59, 60

(56) References Cited

U.S. PATENT DOCUMENTS 5,391,252  *  2/1995  Taylor ................................. 156/345
5,536,359  *  7/1996  Kawada et al. ................... 156/345 X
5,685,912  * 11/1997  Nizhizaka ......................... 156/345 X

OTHER PUBLICATIONS

Hitchman, M.L., Eichenberger, V. A simple method of end–point determination for plasma etching. Journal of Vacuum Science and Technology, vol. 17, No. 6, Nov.–Dec. 1980.

Roland, J.P., Marcoux, P.J., Ray, G.W., Rankin, G.H. End-point detection in plasma etching. Journal of Vacuum Science and Technology, vol. 3, No. 3, May–Jun. 1985, pp. 681–686.

* cited by examiner

*Primary Examiner*—William Powell
(74) *Attorney, Agent, or Firm*—Oppenheimer Wolff & Donnelly LLP

(57) ABSTRACT

A computer implemented method for endpointing an etch process comprising the acts of monitoring an attribute of a pressure control valve and determining an endpoint of the process based upon the monitored attribute. The monitored attribute includes the position of the pressure control valve or the rate of change of the pressure control valve. The method is advantageously employed in an in-situ cleaning process of a polymerized plasma chamber.

9 Claims, 3 Drawing Sheets

PROCESS CONTROL VIA VALVE POSITION AND RATE OF POSITION CHANGE MONITORING

BACKGROUND OF THE INVENTION

This invention relates generally to plasma etch processes, and more particularly to method and apparatus for process control of the etch process via valve position monitoring.

In the fabrication of integrated circuits, the removal of various layers of materials formed on a substrate to define device patterns is commonly accomplished by means of an etching process. Etching techniques in use include wet, or chemical etching, and dry, or plasma etching. The latter technique is typically dependent upon the generation of reactive species from process gases that are impinged on the surface of the material to be etched. A chemical reaction takes place between the material and these species and the gaseous reaction product is then removed from the surface.

With reference to FIG. 1, creating plasma for use in manufacturing or fabrication processes typically begins by introducing various process gases into a plasma chamber 10 of a plasma reactor, generally designated 12. These gases enter the chamber 10 through an inlet 13 and exit through an outlet 15. A workpiece 14, such as an integrated circuit wafer is disposed in the chamber 10 help upon a chuck 16. The reactor 12 also includes a plasma density production mechanism 18 (e.g. an inductive coil). A plasma-inducing signal, supplied by a plasma inducing power supply 20 is applied to the plasma density production mechanism 18. A top portion 22, constructed of a material transmissive to radiation such as ceramic or quartz, is incorporated into the upper surface of the chamber 10. The top portion 22, allows for efficient transmission of radiation from the coil 18 to the interior of the chamber 10. This radiation in turn excites the gas molecules within the chamber generating a plasma 24. The generated plasma 24 is useful in etching layers from a wafer or for depositing layers upon a wafer as is well known in the art.

An important consideration in all etch processes is control of the extent to which the wafer is etched and determining a time, referred to as the endpoint, at which to end the process. Common methods for monitoring the etch process include spectroscopy and interferometry. In the spectroscopic method, the composition of the species in the plasma chamber 10 are monitored. In the interferometric method, a light is directed through a viewing window 25 onto an area of the wafer undergoing etching within the plasma chamber 10. The intensity of the light reflected from the wafer is detected and recorded as a function of time and/or wavelength. Due to the changing optical path through the layer being etched, varying interference patterns are detected and analyzed to determine etch rate, film thickness and the process endpoint.

In an etch process, the total pressure in the plasma chamber 10 is the sum of the pressures from the gas species being delivered and pressures from the etch by-products generated. The gas species pressures are constant due to the nature of the etch recipe.

The pressure due to etch by-products changes as the amount of by-products changes. In order for the plasma chamber pressure to remain constant, as required by the etch recipe, a pressure control valve changes position to compensate for the pressure changes. By monitoring the position of the pressure control valve, information regarding the constituent species in the chamber can be determined.

A specific application of the etch process is an in-situ cleaning process of the plasma chamber 10. A polymerizing oxide etch process is commonly used to etch the oxide films on the substrate. This process leaves polymer within the chamber. The in-situ cleaning process is then carried out to remove the polymer from the inside surfaces of the plasma chamber 10 and thereby clean the inside surfaces. Conventionally this is a timed process, particularly when the number of optical channels available for observing the chamber is limited or none are available. The time set is normally exaggerated to ensure that all of the polymer is etched in a worst case scenario. Overshooting in a timed cleaning process leads to the over-cleaning of the plasma chamber which can cause hardware erosion.

It would be desirable therefore to provide a process control method and apparatus that accurately detects the endpoint of an in-situ cleaning process and thereby overcomes the aforementioned disadvantages of the prior art methods and apparatus.

SUMMARY OF THE INVENTION

The present invention provides a process control method and apparatus via pressure control valve position monitoring for endpointing an in-situ plasma chamber cleaning operation. The invention also finds applicability in endpointing other etch processes as further described hereinbelow.

More particularly, in one embodiment of the invention, a computer implemented method comprises monitoring the pressure control valve position during an in-situ chamber cleaning process and determining an endpoint of the process based upon the monitored position. In another embodiment, a computing system includes a system process having logic for monitoring the pressure control valve position and determining an endpoint based upon the monitored position. In yet another embodiment, a computer program for endpointing an in-situ chamber cleaning process includes a code segment that monitors the pressure control valve position and a code segment that determines the endpoint based upon the monitored position.

The method and apparatus of the present invention provide for an endpoint to the in-situ cleaning process which reduces the over-cleaning of the plasma chamber. Additionally, the method and apparatus of the invention eliminates the necessity of predetermining an end time to the cleaning process and thereby provides for a single cleaning process which automatically determines the process endpoint. Throughput of the etching tool is improved as overshoot times are no longer needed. Finally, the method and apparatus of the present invention allows for monitoring the repeatability of the endpoint detection of in-situ cleaning processes to thereby detect problems with the operation of the etching tool.

These and other advantages of the present invention will become apparent to those skilled in the art upon a reading of the following descriptions of the invention and a study of the several figures of the drawings.

BRIEF DESCRIPTION OF THE DRAWINGS

The present invention will be readily understood by the following detailed description in conjunction with the accompanying drawings, with like reference numerals designating like elements.

DETAILED DESCRIPTION OF THE PREFERED EMBODIMENTS

Figure 1:
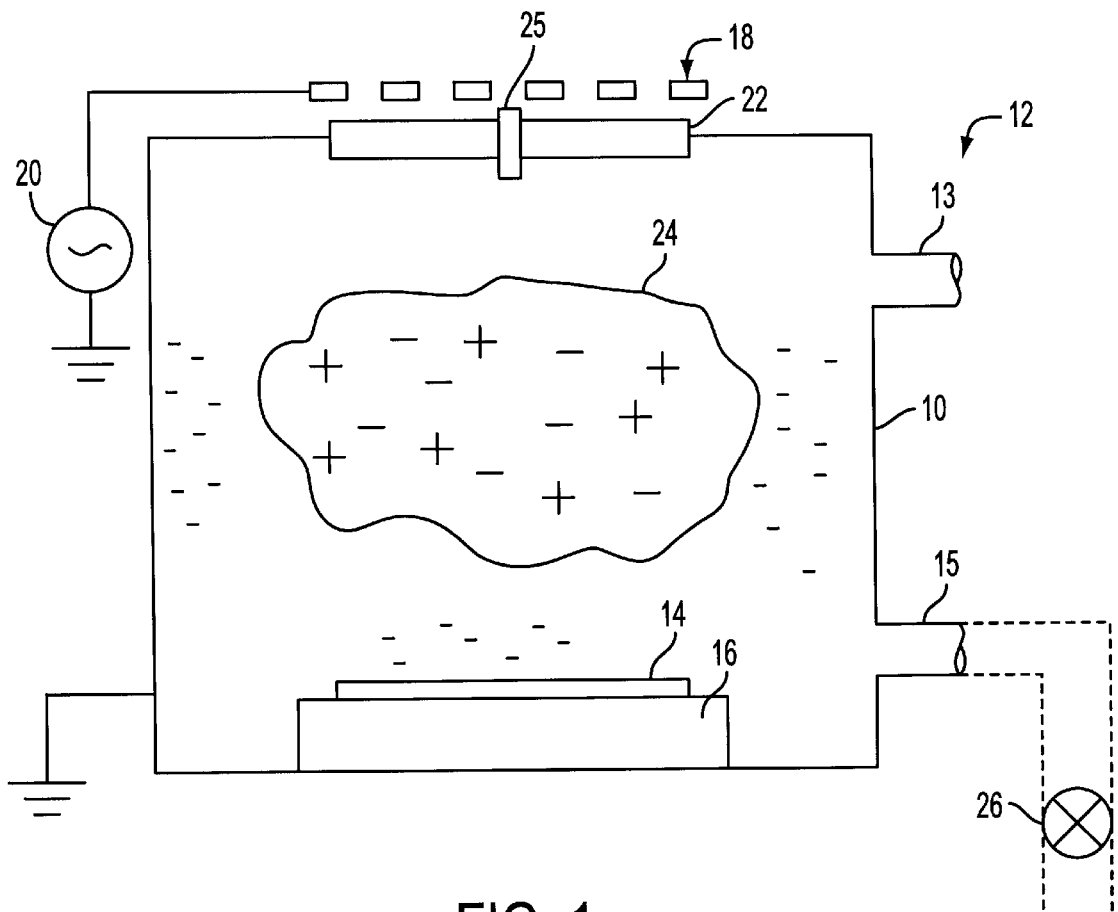
FIG. 1 is a schematic view of a prior art plasma reactor.
Figure 2:
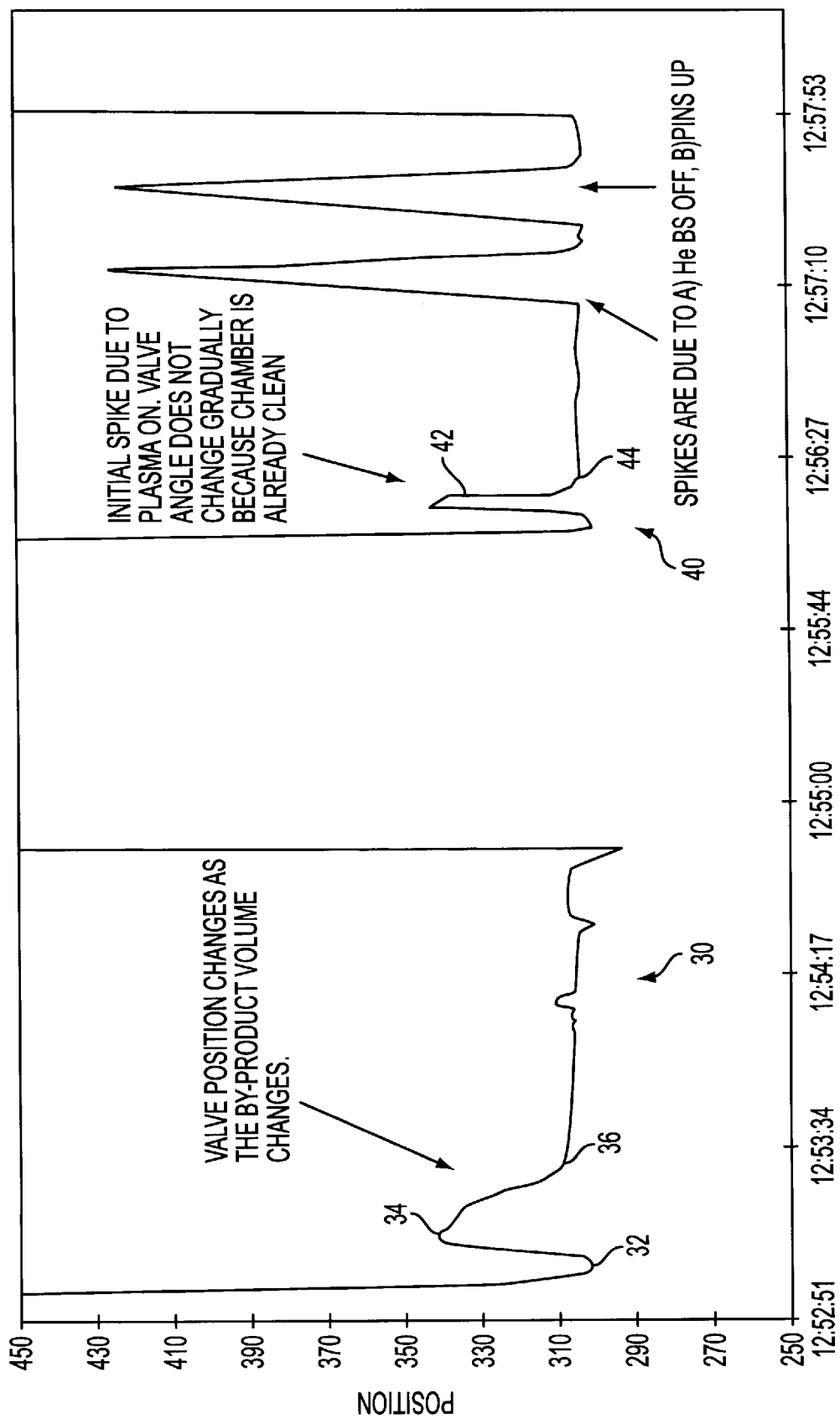
FIG. 2 is a graph showing the position of the pressure control valve with respect to time in an in-situ cleaning process.

In accordance with the method of the present invention, the pressure control valve position is monitored during an in-situ chamber cleaning process and an endpoint of the process is determined based upon such monitoring. With reference to FIG. 2, the first portion of the graph, generally designated 30, corresponds to the position of a pressure control valve 26 during the in-situ cleaning process of a polymerized plasma chamber. Prior to the plasma striking, the valve position is shown at 32. Once the plasma strikes, the valve position changes and is shown at 34. As the polymer is removed from the chamber, less species are present in the chamber and the valve position changes to maintain a constant pressure within the chamber. Once the bulk of the polymer has been removed, the valve position remains substantially constant as shown at 36 indicating the process endpoint. The endpoint can be determined either by monitoring the absolute change in valve position or by monitoring the rate of change of the valve position.

The position of the pressure control valve 26 as a function of time during an in-situ cleaning of a clean plasma chamber is shown in FIG. 2 and generally designated as 40. When the plasma strikes, the position of the valve is shown at 42. As there are no polymer by products in the chamber as a result of the etching process, the valve returns to it's original position as shown at 44, indicating that the chamber is clean.

Figure 3:
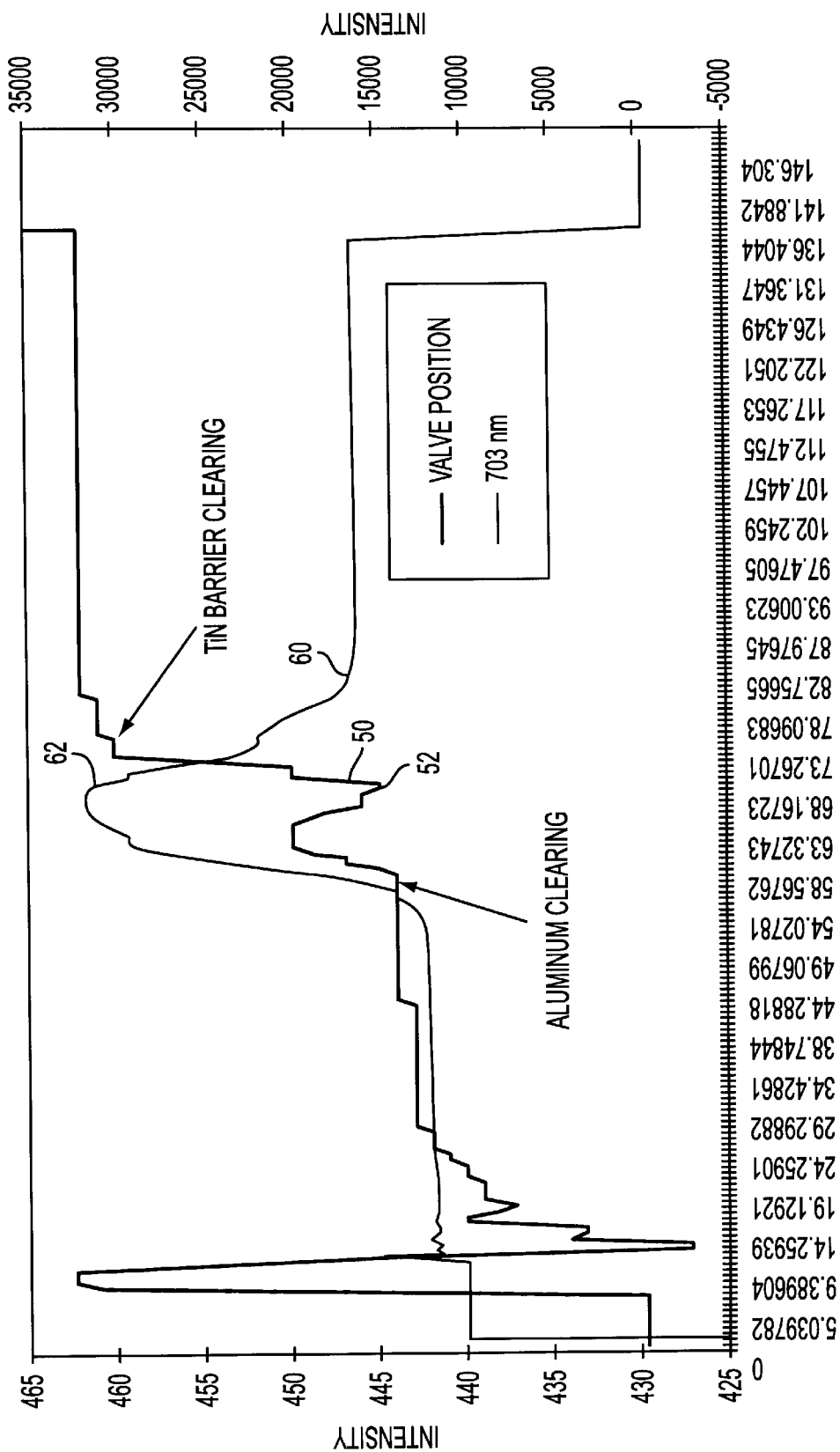
FIG. 3 is a graph showing the position of the pressure control valve with respect to time in a metal etch process.

The applicability of the present method and apparatus to a metal etch process is shown in FIG. 3 wherein the pressure control valve position is plotted against time and generally designated 50. A plot of a spectroscopic signal corresponding to the optical intensity at 703 nm is also plotted against time for comparison purposes and generally designated 60. The system of the present invention provides a more accurate indication of film clearing in this configuration. As shown, the valve position reaches a minimum at 52 just as the intensity signal begins to drop at 62, anticipating the film clearing as determined by the spectroscopic method.

In a preferred embodiment of the invention, a computer implemented method for monitoring the position of a pressure control valve comprises monitoring the position of the pressure control valve and determining a process endpoint. The process endpoint is determined by monitoring an absolute change in the valve position or the rate of change of the valve position.

In another embodiment of the invention, a computer system for monitoring the position of a pressure control valve comprises a system process having logic for monitoring the position of the valve and a system process for determining a process endpoint based upon the monitored position of the valve. The process endpoint is determined by monitoring an absolute change in the valve position or the rate of change of the valve position.

In yet another embodiment of the invention, a computer program for monitoring the position of a pressure control valve comprises a code segment for monitoring the position of the valve and a code segment for determining the process endpoint based upon the monitored position. The process endpoint is determined by monitoring an absolute change in the valve position or the rate of change of the valve position.

Although only a few embodiments of the present invention have been described in detail herein, it should be understood that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

What is claimed is:

1. A computer implemented method for endpointing an etch process comprising the acts of:

monitoring an attribute of a pressure control valve; and determining an endpoint of the process based upon said monitored attribute.

2. A computer implemented method as recited in claim 1 wherein the attribute is a position of the pressure control valve.

3. A computer implemented method as recited in claim 1 wherein the attribute is a rate of change of the position of the pressure control valve.

4. A computing system for endpointing an etch process comprising:

a system process having logic for monitoring an attribute of a pressure control valve; and a system process having logic for determining an endpoint of the process based upon said attribute.

5. A computing system as recited in claim 4 wherein the attribute is a position of the pressure control valve.

6. A computing system as recited in claim 4 wherein the attribute is a rate of change of the position of the pressure control valve.

7. A computer program for endpointing an etch process comprising:

a code segment for monitoring an attribute of a pressure control valve; and a code segment for determining an endpoint based upon said attribute.

8. A computer program as recited in claim 7 wherein the attribute is a position of the pressure control valve.

9. A computer program as recited in claim 7 wherein the attribute is a rate of change of the position of the pressure control valve.

* * * * *